United States Patent [19]
Kessoku et al.

[11] Patent Number: 5,473,505
[45] Date of Patent: Dec. 5, 1995

[54] IC CARD DATA PROCESSING DEVICE WHICH CAN BE INTEGRALLY HOUSED WITHIN A COMPUTER

[75] Inventors: Hirobumi Kessoku, Yokohama; Kenzo Yoshimatsu, Kawasaki; Atsushi Murata, Chigasaki, all of Japan

[73] Assignee: Kabushiki Kaisha Toshiba, Kawasaki, Japan

[21] Appl. No.: 123,084

[22] Filed: Sep. 20, 1993

[30] Foreign Application Priority Data

Oct. 19, 1992 [JP] Japan .................................. 4-280322

[51] Int. Cl.⁶ .............................. G06F 1/16; H05K 7/10; H01R 13/62
[52] U.S. Cl. ..................... 361/684; 439/159; 439/653; 439/377; 439/260
[58] Field of Search ..................... 364/708.1; 439/152, 439/159, 160, 638, 650, 653, 377, 928, 259, 260; 273/148 B, 435; 361/684, 737, 754, 756, 741, 798

[56] References Cited

U.S. PATENT DOCUMENTS

| | | | |
|---|---|---|---|
| 4,844,465 | 7/1989 | Hibino et al. | 273/148 B |
| 4,980,856 | 12/1990 | Ueno | 361/684 |
| 5,112,051 | 5/1992 | Darling et al. | 273/148 B |
| 5,155,663 | 10/1992 | Harase | 361/684 |
| 5,184,282 | 2/1993 | Kaneda et al. | 361/737 |

FOREIGN PATENT DOCUMENTS 3-124262  12/1991  Japan .

*Primary Examiner*—Michael W. Phillips
*Attorney, Agent, or Firm*—Cushman, Darby & Cushman

[57] ABSTRACT

An IC card data processing device, insertable into a standard memory expansion card slot of a computer, includes an outer main frame and an inner main frame to which the inner main frame is fixed. Within the inner main frame, first and second aligning mechanisms are provided respectively near an entrance and at a distal end of an IC card insertion path for aligning IC card inserted into the path. A slider, urged by springs toward the entrance end of the IC card insertion path, is moved toward the distal end by the inserted IC card. A link is connected between the slider and a card release button so that when the release button is pressed, the slider moves toward the entrance of the IC card insertion path to eject the card. A contact holder is fitted within an opening of the slider. The contact holder holds contacts for making an electrical connection with the IC card. The contact holder is moveable only in a vertical direction with respect to the IC card insertion path by a contact holder moving means to move the contacts into contact when the IC card is fully inserted and out of contact while the IC card is being inserted or ejected. The data processing device further consists of a read/write mechanism which can be electrically connected to the IC card, a read/write control portion for controlling the read/write mechanism and a connector for connecting the device to a computer.

19 Claims, 12 Drawing Sheets

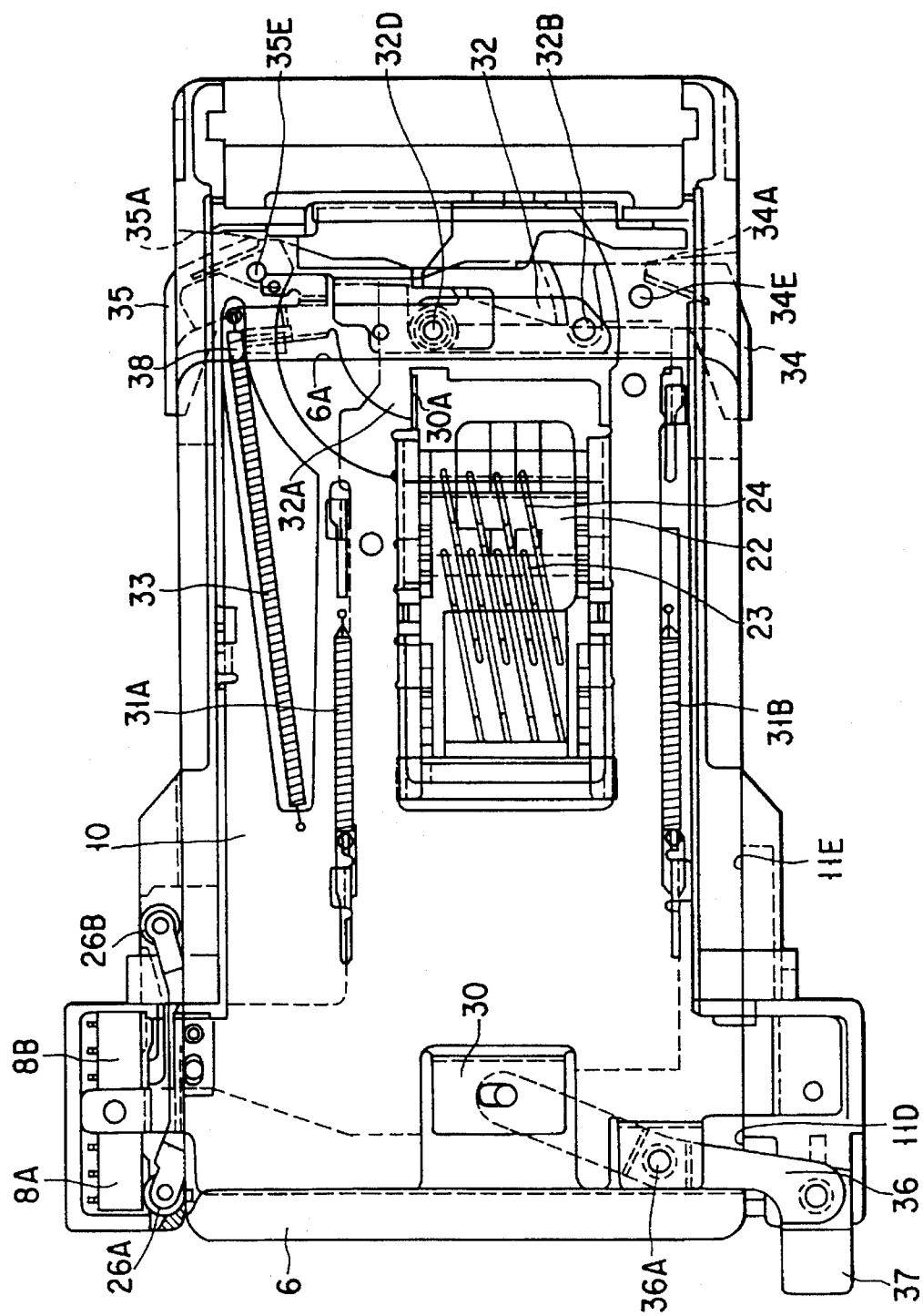
F I G. 5

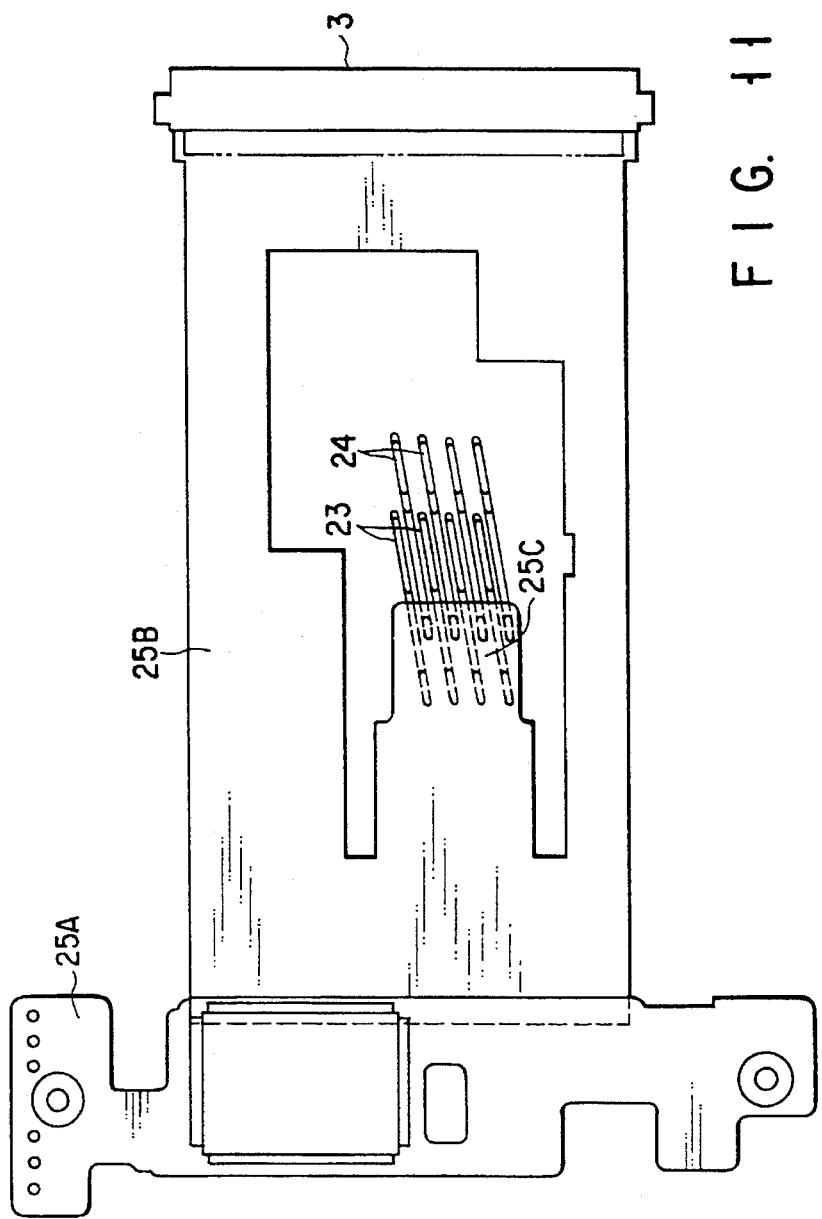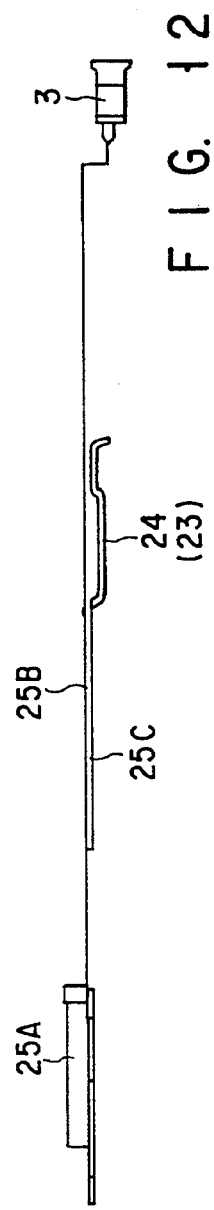
F I G. 11
F I G. 12

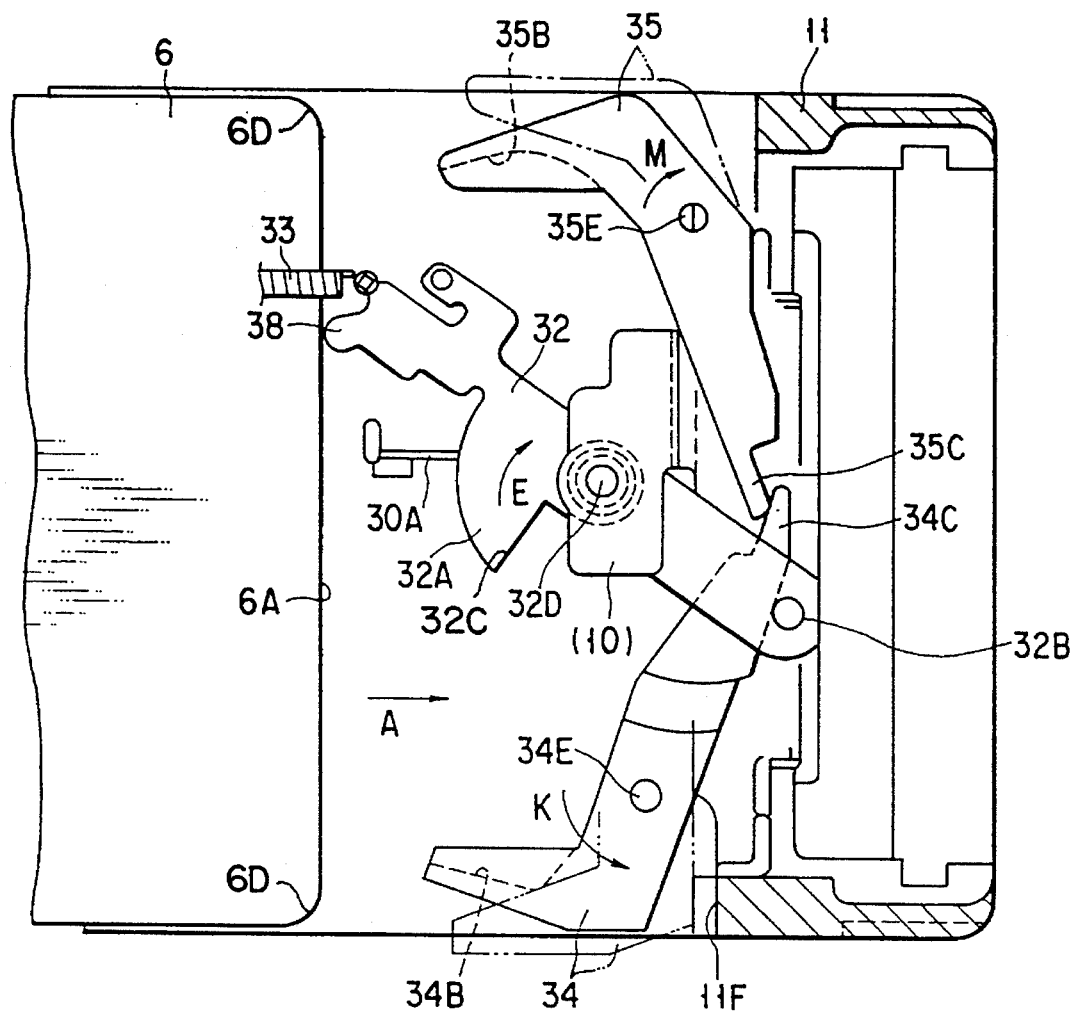
F I G. 15

IC CARD DATA PROCESSING DEVICE WHICH CAN BE INTEGRALLY HOUSED WITHIN A COMPUTER

BACKGROUND OF THE INVENTION

1. Field of the Invention

The present invention relates to an IC card data processing device which can read/write data. More specifically, the present invention relates to a data processing device for an IC card, which is connectable, when used, to a computer device such as a portable personal computer.

2. Description of the Related Art

Conventionally, an IC card data processing device is, when used, connected to an external interface such as RS-232 interface extending from a computer device by means of a connector cable or the like.

A portable computer device generally has an expansion slot which can receive an expansion card for expanding the functionality of the computer. Recently, the standardization of the size of such expansion cards has been proposed.

The PCMCIA card slot is an example of such a standard. PCMCIA (PC memory card international association), an association for standardizing expansion IC cards in the United States, has set a standard for the cards inserted into this slot.

An IC memory containing a semiconductor memory is called "Type 2," and the thickness (size) is determined to be 5 mm.

As mentioned, the conventional IC card data processing device is a large component that is separate from a computer to which the device is connected.

A known data processing apparatus has an adapter of the type enclosed in Japanese Patent Publication No. 3-124262. The adapter is shaped like a memory card and can accommodate memory cards of various sizes. However, an IC card of the type defined in Part 2 of ISO 7861, which has contacts on one surface, cannot be electrically connected to the adapter since the connector of the IC card is different in shape from that of the memory card. To process the data stored in the IC card defined in Part 2 of ISO 7816, the data processing apparatus must be connected to an RS-232C interface or the like. Also, the data processing apparatus must be connected to an interface, such as an RS-232C interface, by means of a connector cable or the like. Therefore the area in which the apparatus can be used is restricted, and the apparatus is cumbersome to carry. Further, because the data processing apparatus occupies the interface (RS-232C or the like), the data processing apparatus must be disconnected in order to connect some other I/O device to the interface.

SUMMARY OF THE INVENTION

It is an object of the present invention to avoid the above-described drawbacks of conventional IC card data processing devices. It is a further object of the present invention to provide an IC card data processing device, wherein the data processing device can be inserted and connected to the standardized memory card slot of a computer, such as a portable personal computer, can be used and housed integrally within the computer, has a significantly improved utility with a wider area of use, does not occupy an interface port, such as an RS-232C port, and can be used while other I/O devices, or the like, are connected to the interface. Therefore, to achieve the above-described objects, there is provided an IC card data processing device comprising:

a main structure having a card insertion opening into which an IC card is inserted and having an outer size that allows it to fit within a memory card slot of a computer device;

a contact member which can be brought into contact with a point of contact of an IC card inserted into the card insertion opening of the main structure;

a control circuit electrically connectable to the contact for controlling a read/write operation from the IC card; and a connector for connecting the control circuit portion to a standardized memory card connector of the computer.

With the above-described structure, an IC card data processing device is, inserted into the memory card slot of a computer. Consequently, the device can be used and carried integrally within the computer, and without occupying the interface, thereby allowing other I/O devices to be connected to the computer by its interface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 5 is a plan view showing the structure of the embodiment, some of the parts removed, when no IC card is inserted;

FIG. 11 is a plan view showing the contact being electrically connected to the control circuit and the connector by means of the flexible substrate of the embodiment;

FIG. 12 is a side view of what is shown in FIG. 11;

FIG. 15 is a partial cutaway plan view showing the state of an IC card approaching the read/write position;

DETAILED DESCRIPTION OF THE PREFERRED EMBODIMENT

An embodiment of the present invention will now be described with reference to accompanying drawings.

Figure 1:
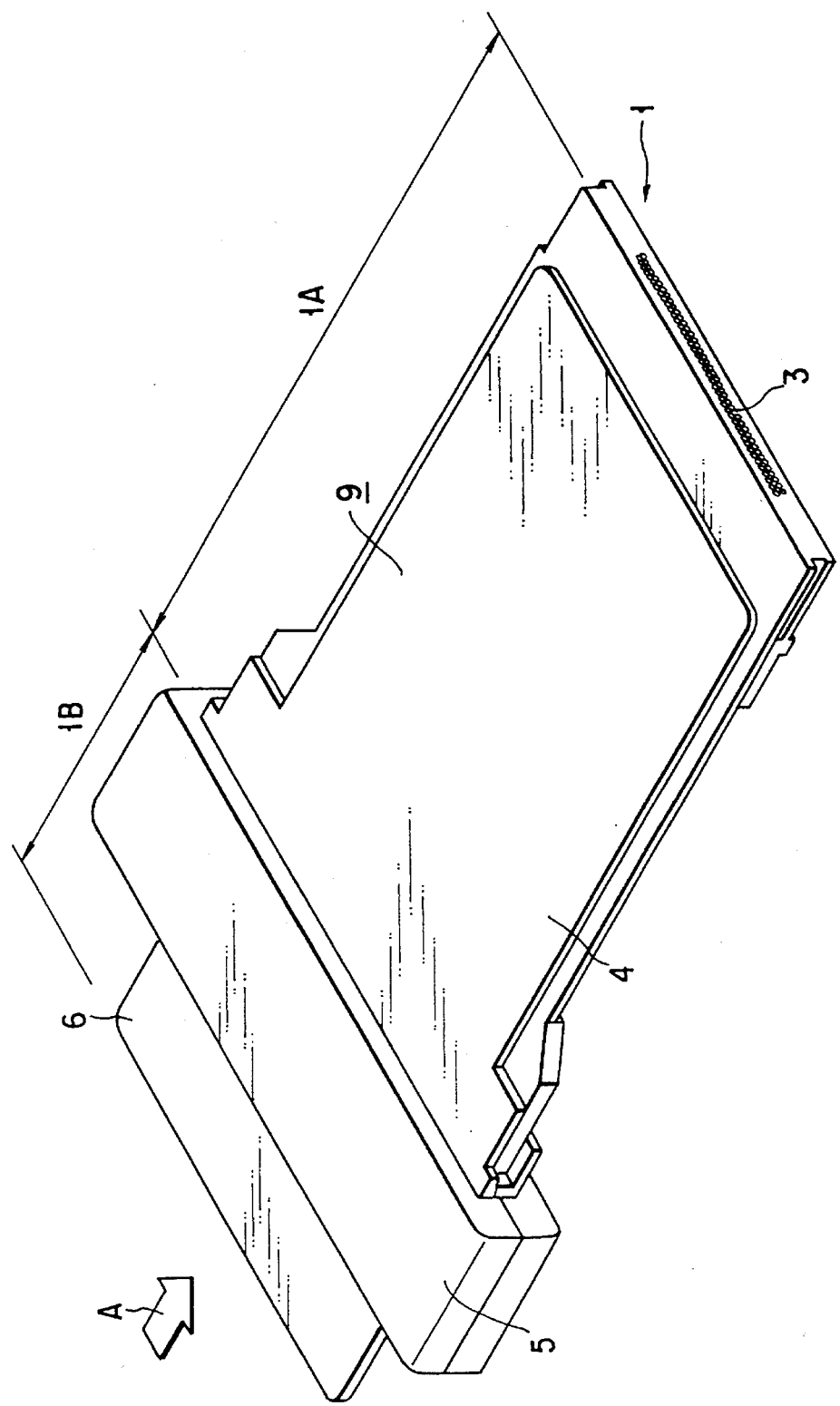
FIG. 1 is a perspective view showing a preferred embodiment of the IC card data processing device according to the present invention.
Figure 2:
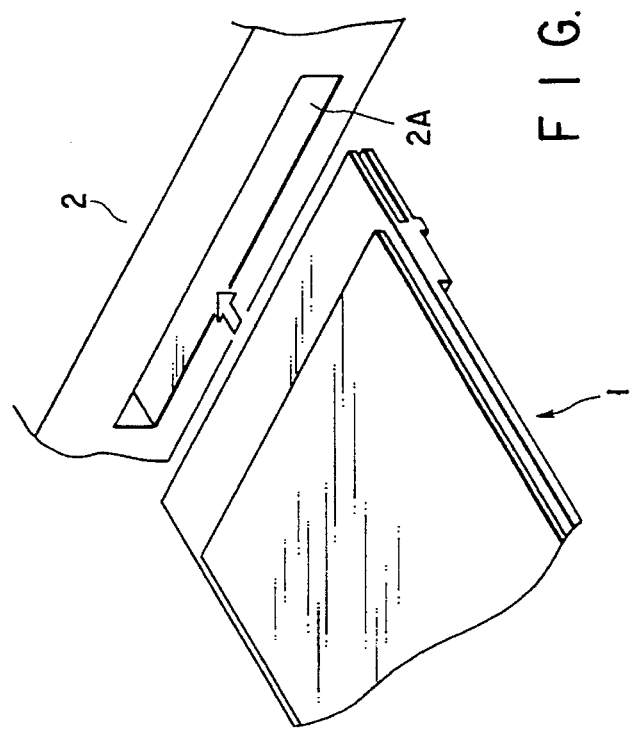
FIG. 2 is partial perspective view of a memory card slot portion of a book-type personal computer into which the IC card data processing device is inserted.

FIG. 1 shows an IC card data processing device 1 of the present invention. FIG. 2 shows a memory card slot 24 a book-type personal computer 2, into which a memory card (not shown) such as an expansion memory can be inserted.

The internal structure of the memory card slot 2A of the computer 2 has a shape and size in accordance with the standard for each type of memory card. AS the IC card data processing device 1 of the invention is inserted into the memory card slot 2A, the connector portion 3 formed on the distal end of the data processing device is electrically connected to the connector 2B in the computer 2 (see FIG. 13).

In most cases, the IC card data processing device 1 has a shape and size which meet the standard for the memory card, and more specifically, has a maximum thickness of 5 mm, and a width of 54 mm , which is substantially the same as that of an IC card 6. The data processing device consists of an inserted portion 1A and a projecting portion 1B formed integrally with each other. The inserted portion 1A is disposed inside the memory card slot 2A, whereas the projecting portion 1B projects from the computer 2 when the processing device is inserted into the computer. It should be noted that the projecting portion 1B, which extends outside the computer, can be formed into such a manner that it too can be inserted into the memory card slot 2A of the computer 2.

Figure 4:
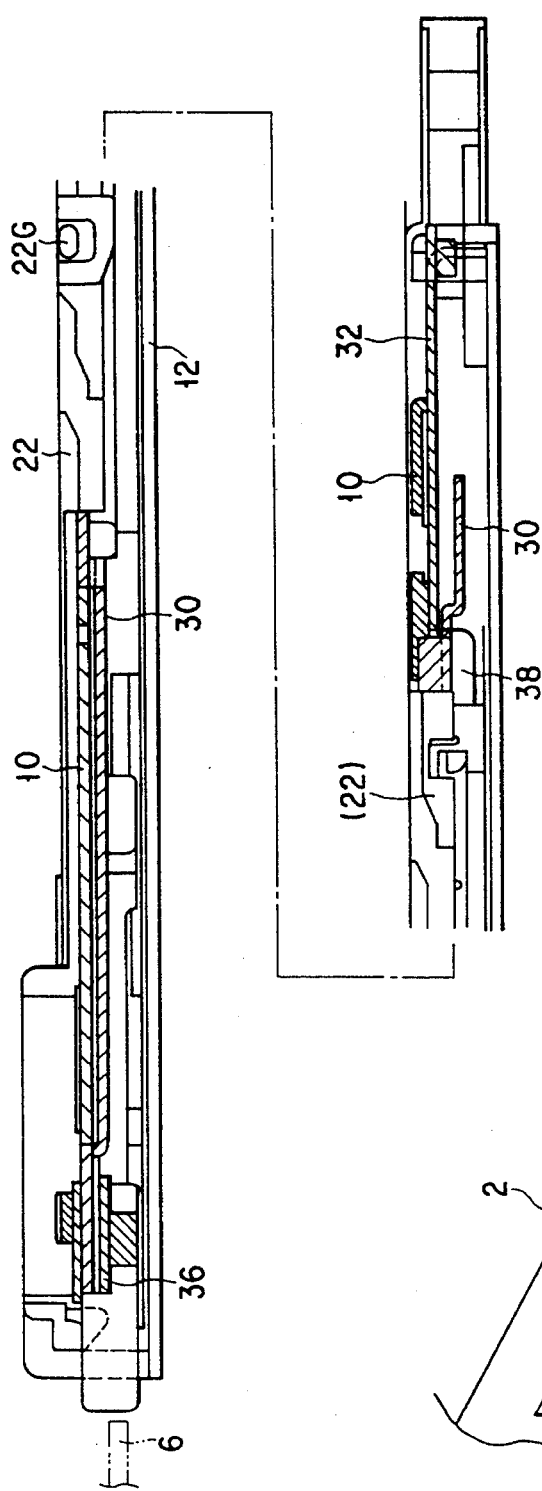
FIG. 4 is a cross section of the embodiment.
Figure 3:
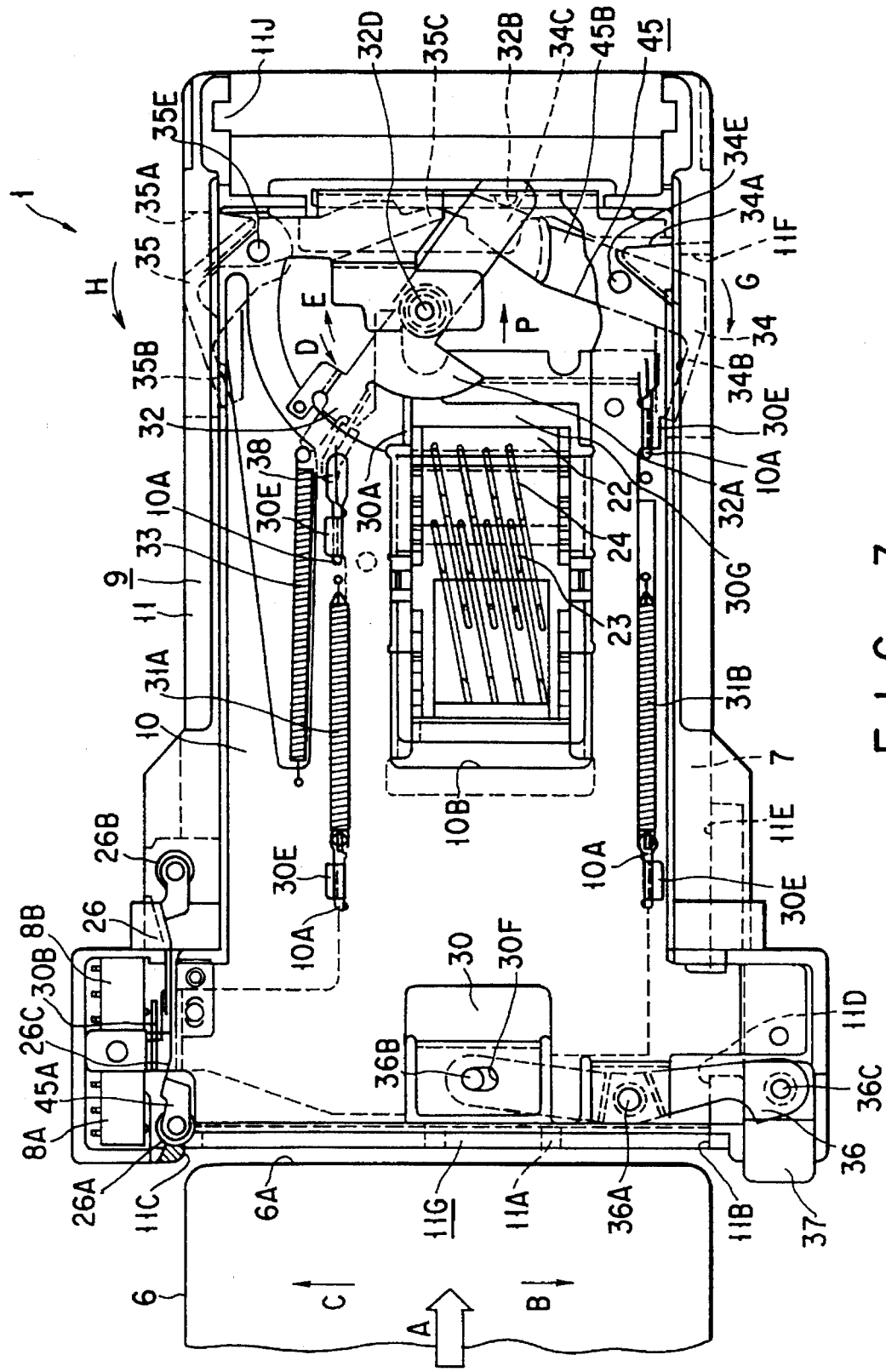
FIG. 3 is a plan view showing the structure of the embodiment, some of the parts removed, when no IC card is inserted.

The internal structure of the IC card data processing device 1 will be described with reference to FIGS. 3, 4, and 5. FIG. 3 shows the embodiment from which a cover member 4 (see FIG. 1) of the inserted portion 1A, a cover member 5 (see FIG. 1) of the projecting portion 1B, and a flexible substrate 25B (FIG. 11) are removed. The flexible substrate is for connecting a connector 3 and a control circuit portion 25A, and will be described later with reference to FIGS. 11 and 12. Also in FIG. 3, an IC card 6 is not inserted. FIG. 5 shows the state in which an IC card 6 is inserted.

The main body 9 of the device consists of an inner main frame 10 for holding the structural members, and an outer main frame 11 to which the inner main frame 10 is fixed, the outer main frame 11 defining the device's outer structure. The inserted portion 1A can be held within the memory card slot 2A, formed in the main frame 11, which is the frame structure of the main body 9, and has a shape and measurements which meets the standard of the memory card of the desired application.

The end face of the projecting portion 1B of the main frame 11 has a card insertion opening 11G including guide portions 11A, 11B, and 11C for guiding the IC card 6 when it is inserted. The card insertion opening 11G has a wide entrance and is formed to narrow to a certain size toward the insertion direction (direction A indicated by arrow) of the IC card 6.

Close to the guide portion 11C of the guide insertion opening 11G, are guide rollers 26A and 26B which are urged by a guide roller spring 26C in the right-hand side direction (direction indicated by arrow B) with respect to the direction of the insertion of the IC card 6. Guide rollers 26A and 26B are rotably supported so as to constitute card urging means 26. The IC card 6 is pressed by the guide rollers 26A and 26B in the direction indicated by arrow B, and is abutted against guide portions 11D and 11E arranged on one side one an IC card insertion path 7, which communicates with the card insertion opening 11G, thereby aligning the IC card in the width direction near the card insertion opening 11G.

Thus, constructed is the first aligning mechanism 45A for aligning the end portion of the IC card 6 in the width direction.

Further, the main frame 10 has a plurality of slits 10A (four in this embodiment) on its bottom surface side. Nail portions 30E are each engaged with each slit, thereby movably holding a slider 30 along the IC card insertion path 7. The slider 30 is urged in the depth direction (indicated by arrow P) of the IC card insertion path 7 by means of the springs 31A and 31B.

The slider 30 has an elongated opening 30F at the center (in the width direction) of its end portion located near the IC card insertion opening 11G. A link 36 is held rotatably in the main frame 10 via a shaft 36A, and a pin 36B projecting from one side of the link 36 is engaged with the elongated opening 30F to form a junction.

A release button 37 serving as an ejection means is joined to the other side of the link 36 via a pin 36C so that when the release button 37 is pressed, the slider 30 is moved in the direction opposite to arrow P (left-hand side direction in FIG. 3).

Figure 6:
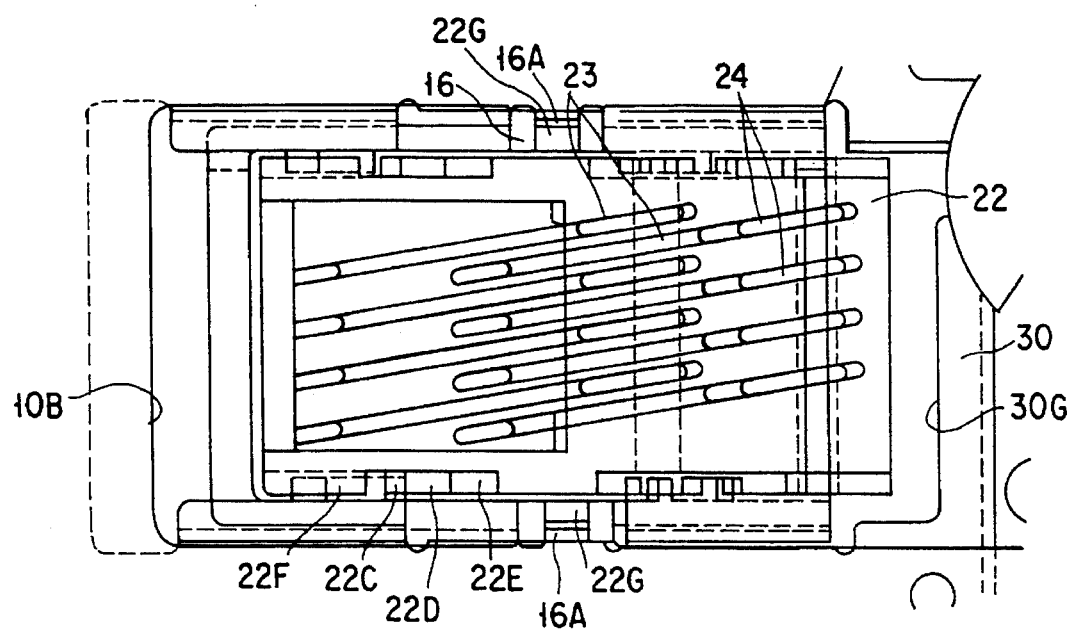
FIG. 6 is an enlarged view of a part of the embodiment shown in FIG. 5.

At the center portion of the slider 30, there is formed an opening 30G corresponding to the opening 10B formed in the main frame 10, and a contact holder 22 is fitted into the opening 30G. The contact holder 22 can be moved only in the vertical direction as projections 22G formed in the center of each side surface, as shown in FIG. 6, are engaged with slide grooves 16A formed in each side surface of the contact guard 16, which is fixed to the opening 10B of the main frame 10.

Figure 7:
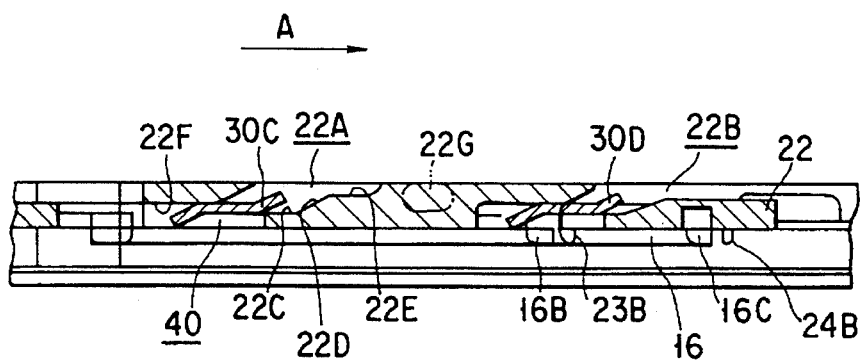
FIG. 7 is a cross section of the main section of the embodiment designed to illustrate the operation of the contact holder at an elevated level.
Figure 8:
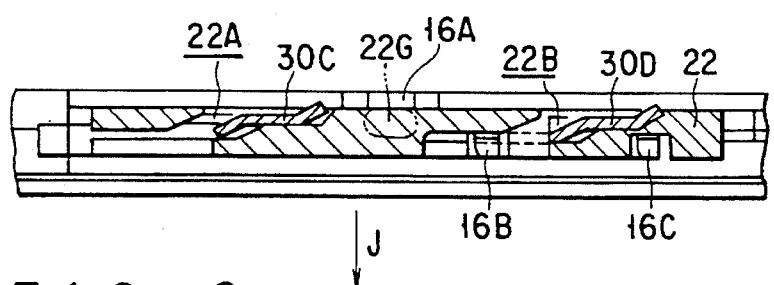
FIG. 8 is a cross section of the main section of the embodiment, designed to illustrate the operation of the contact holder at a lowered level.

As can be seen in FIGS. 7 and 8, in both side surfaces of the contact holder 22, guiding grooves 22A and 22B are formed, with which crank-shaped projections 30C and 30D, formed on the slider 30, are engaged to form contact holder moving means 40. With such a structure, as the slider 30 moves back and forth (reciprocates) along the direction indicated by arrow A, the contact holder 22 moves up and down.

In the end region of the IC card insertion path 7, a moving member means such as lever 32 is provided which can be pivoted via a pivot 32D projecting from the main frame 10, and urged by means of a spring 33 such as to be pivoted in the counter-clockwise direction (indicated by arrow D).

On one end of the lever 32, a card abutment portion 38 made of a self-lubricative material, abuts the end face of the IC card 6 when the IC card is inserted. The lever 32 is pivoted in the clockwise direction (indicated by arrow E) as the card abutment portion 38 is pressed by the IC card being inserted.

The lever 32 has a fan-shaped portion 32A serving as a stopper which abuts a bent-up portion 30A of the slider 30 so that the slider 30 does not move beyond the stopper. Fan-shaped portion 32A has such a shape that the slider 30 can move over to the right-hand side in the figure (indicated by arrow P) and be stopped at the blank section of the fan-shaped portion 32A by pivoting of the lever 32 in the clockwise direction (indicated by arrow E) when the IC card 6 is brought to the predetermined position.

The first guide member 34 interposed between the main frame 10 and a base frame 12 (see FIG. 4) and held pivotally at 34E is provided near the lever 32, and on the alignment reference side. The first guide member 34 is urged in the clockwise direction (indicated by arrow G) by means of a spring 34A, and housed inside the main frame 11 in the normal state.

The first guide member 34 has a portion 34C abutting the projection 32B on the lever 32, and a receiving surface 34B into which the end of the IC card 6 is brought when the receiving surface is pivoted in the counter-clockwise direction to a predetermined position by the projection 32B of the lever.

The second guide member 35 interposed between the main frame 10 and the base frame 12 and held pivotally at 35E is provided near the lever 32 is located and on the pressing side, opposite to the alignment reference side. The second guide member 35 is urged in the counter-clockwise direction (indicated by arrow H) by means or a spring 35A, and housed inside the main frame 11 in the normal state.

The second guide member 35 has a portion 35C abutting the guide 34, and a receiving surface 35B into which the end of the IC card 6 is brought.

The spring 35A for urging the second guide member 35 in the direction indicated by arrow H is stronger than the spring 34A for urging the first guide member 34 in the direction indicated by arrow G.

The first guide member 34 located on the alignment reference side and pivoted when the IC card 6 is brought to the predetermined position, abuts the receiving portion 11F of the main frame 11 serving as stopper means so as not to further pivot in the direction indicated by arrow G.

In contrast, a member corresponding to the receiving portion 11F is not provided for the second guide 35 on the pressing side such that the second guide 35 has a clearance. With this structure, when the IC card is brought to the predetermined position, the width-direction position of the front end is determined by the first guide member 34 on the reference side. Thus, constructed is the second alignment mechanism 45B for aligning the front side of the IC card 6 in the width direction.

As described, the device of the present invention includes alignment means 45 having first and second alignment mechanisms 45A and 45B for aligning the IC card 6 in the width direction when the card 6 is brought to the predetermined position.

Further provided are a microswitch 8A for detecting the insertion of an IC card, and a microswitch 8B for detecting the installment of the IC card, both near the card insertion opening 11G and fixed to the main frame 11.

When an IC card 6 is inserted, the guide roller 26A is moved in the direction indicated by arrow C, thereby turning on the switch 8A. Further, when an IC card 6 is inserted deeply to the end portion of the card insertion path 7, the slider 30 is moved in the direction indicated by arrow A. The slider 30 has a bent-up portion 30B having such a slope section that gradually approaches the switch 8B. As the slider 30 moves, the switch 8B is turned on by the bent-up portion 30B.

The structure of the contact holder 22 will be described with reference to FIGS. 6 through 10.

As described, the contact holder 22 has guide grooves 22A and 22B on its side surfaces, the grooves 22A and 22B engaging with the crank-shaped projections 30C and 30D, respectively, of the slider 30 as shown in FIGS. 7 and 8. The guide groove 22A includes cam surfaces 22C, 22D, 22E, and 22F with which the crank-shaped projection 30C is brought into contact. The contact holder 22 has projections 22G on both sides, and is movable only in the vertical direction by means of the slide grooves 16A provided in the contact guard 16.

When the slider 30 is moved to the right-hand side (indicated by direction A), the lower surface of the crank-shaped projection 30C is moved along the cam surfaces 22C, 22D, and 22E to push the contact holder 22 down (arrow J direction). When the slider 30 returns, the upper surface of the crank-shaped projection 30C pushes up the contact holder 22 via the cam surface 22F.

Figure 9:
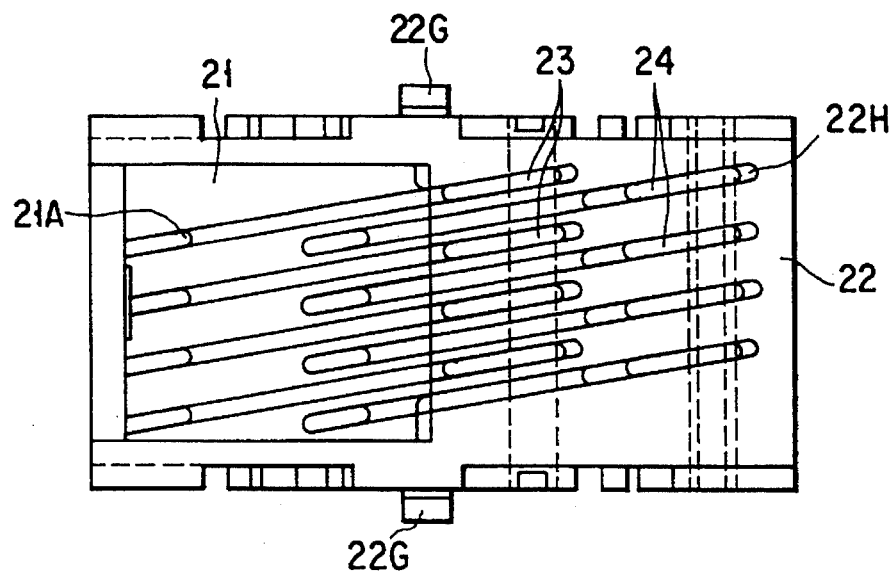
FIG. 9 is a plan view of the contact holder of the embodiment.

The contact holder 22 has a number of slender grooves 22H arranged at an angle as can be seen in FIG. 9. Contact members such as contacts 23 and 24 which are elongated members are engaged with these grooves.

Figure 10:
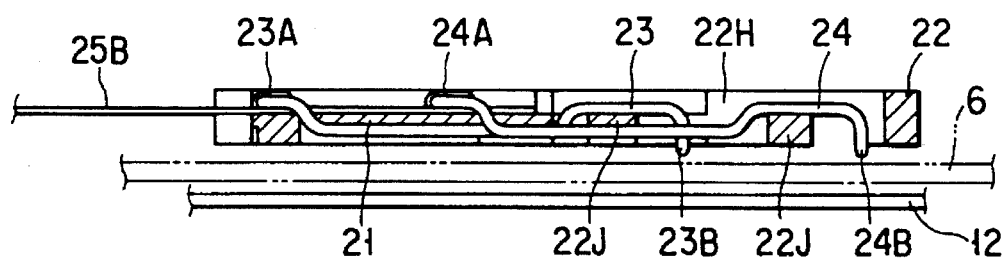
FIG. 10 is a cross section of the contact holder.

As shown in FIGS. 9 and 10, the contacts 23 and 24 are inserted through the opening 21A from the lower side of the auxiliary contact holder 21, and held onto the flexible substrate 25B by welded portions 23A and 24A.

The auxiliary contact holder 21 is fit into and fixed on the contact holder 22, and the contacts 23 and 24 are fit to the groove 22H. The auxiliary contact holder 21 is urged to the receiving portion 22J at a predetermined pleasure by means of the spring force of the contacts 23 and 24 themselves.

When the contact holder 22 moves downward, and the contact portions 23B and 24B of the contacts are pressed against the IC card 6, the contacts 23 and 24 are pushed up such as to be separated from the receiving portion 22J. Consequently, the pressure applied in advance is released, and the IC card is connected at a predetermined connecting pressure.

As shown in FIG. 7, lower surfaces 16B and 16C of the contact guard 16 are arranged to protect downward further than the top of each of the contact portions 23B and 24B. With this structure, when an IC card 6 is inserted, collision of the IC card 6 with the contact portions 23B and 24B is prevented, and the IC card 6 is protected from deformation.

Since the contact holder 22 has the minimum necessary members for holding the contacts 23 and 24 a thickness required to make each of the contacts 23 and 24 is minimized.

The contact holder 22 itself, which requires the greatest thickness, does not move in the insertion and discharge direction of the IC card 6. Therefore, the region which usually has a relatively large thickness can be constructed with a minimum thickness, which can contribute to thinning of the product device.

The contacts 23 and 24 are, as shown in FIGS. 11 and 12, electrically connected to the control circuit portion 25A by means of the flexible substrate 25B. The control circuit portion 25A is electrically connected to the connector by the flexible substrate 25B. A standardized memory connector or the like is used as the connector 3 so that the memory connector can be connected to the connector 2B of each of the variety of computer devices by use of its memory card slot 2A.

The connector 3 is fitted in a fitting portion 11J formed at the front end portion of the main frame 11, and the flexible substrate 25B and the control circuit portion 25A are fixed to the main frame 10. Only the contact connection portion 25C has a structure which gives an allowance to the IC card 6 in the direction away from the card.

An embodiment of the hardware structure which can be applied to the IC card data processing device 1 of the present invention will now be described with reference to FIG. 13.

The IC card data processing device 1 mainly consists of three blocks.

More specifically, the device 1 consists of a read/write mechanism portion 50, which can be electrically connected to the IC card 6, for detecting the insertion and installment of an IC card 6, a read/write control portion 51 for controlling the read/write mechanism portion, and a connector 3 connected to a computer device 2 into which the device is inserted.

The read/write mechanism portion 50 includes an insertion detection switch 8A, such as described before, an installment detection switch 8B, contacts 23 and 24, and LED 50A for indicating the ON/OFF state of the power, the access of data, and the like.

The read/write control portion 51 includes a CPU (central processing unit) 51C serving as the aforementioned control circuit portion 25A, a memory 51D for storing and processing program and data, a driver 51A for lighting the LED 50A, and an interface 51B for an IC card 6.

The read/write mechanism 50 is connected to the CPU 51C in the following manner. Switches 8A and 8B are connected directly to the CPU 51C. An IC card contact 23 is connected to an IC card interface 51B by a connector 60A, and the interface 51B is connected to the CPU 51C by a connector 60B. An LED 50A is connected to the CPU 51C by a driver 51A. The CPU 51C is connected to a memory 51D by an address, data bus or the like, and to a connector 3 by an I/O signal line 60C and a power source line 60D.

The procedure of use and operation of the IC card data processing device 1 will now be described with reference to mainly FIGS. 14 through 17.

Figure 13:
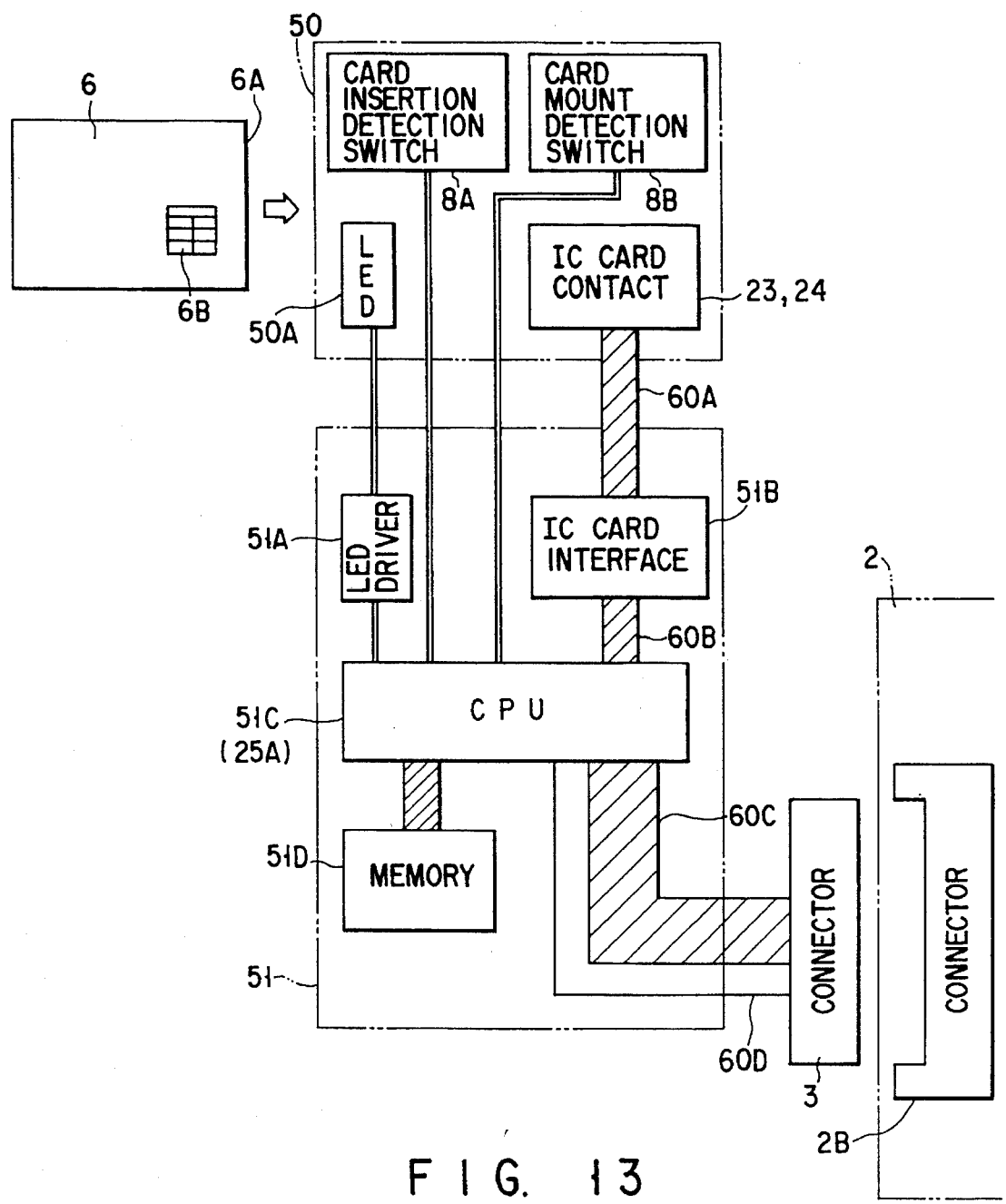
FIG. 13 is a cross section of the contact holder, the main section of the embodiment.
Figure 14:
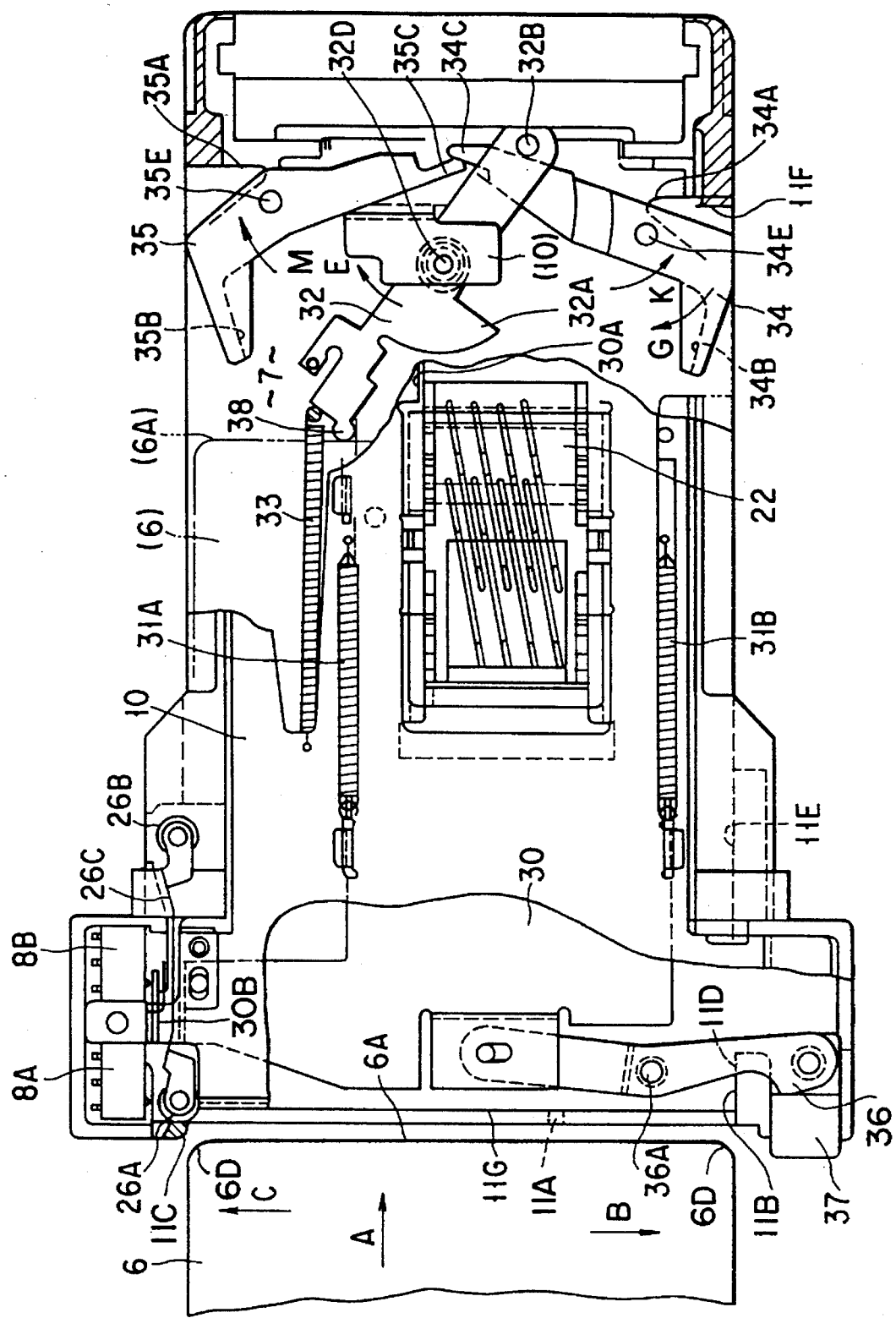
FIG. 14 is a partially cutaway plan view showing the embodiment in which no IC card is inserted.

An IC card 6 to be read/written is inserted into a card insertion opening 11G from the state shown in FIGS. 13 and 14. The IC card 6 moves in the right-hand direction (indicated by arrow A) through an IC card insertion path 7 while being guided by guiding surfaces 11A, 11B, and 11C to a predetermined position. As the IC card moves, the guide roller 26A is pressed in the direction indicated by the arrow C, turning the switch 8A "ON". Thus, the insertion of the IC card 6 is detected.

As the IC card 6 is further pressed in the right-hand side direction, the guide roller 26B is accordingly pushed up in the direction indicated by arrow C. Since the guide rollers 26A and 26B are urged in the direction indicated by arrow B by means of a spring 26C, the IC card 6 is pressed in the direction B, against the guide surfaces 11D and 11E. Thus, as the IC card moves it is aligned in the width direction.

As the IC card 6 is further moved in the right-hand direction, and passes the position indicated by the double-dot line in FIG. 14 (the position indicated by the solid line in FIG. 15), in other words, as the front end 6A of the card passes the contact holder 22, the front end 6A abuts the distal end 38 of the lever.

Figure 16:
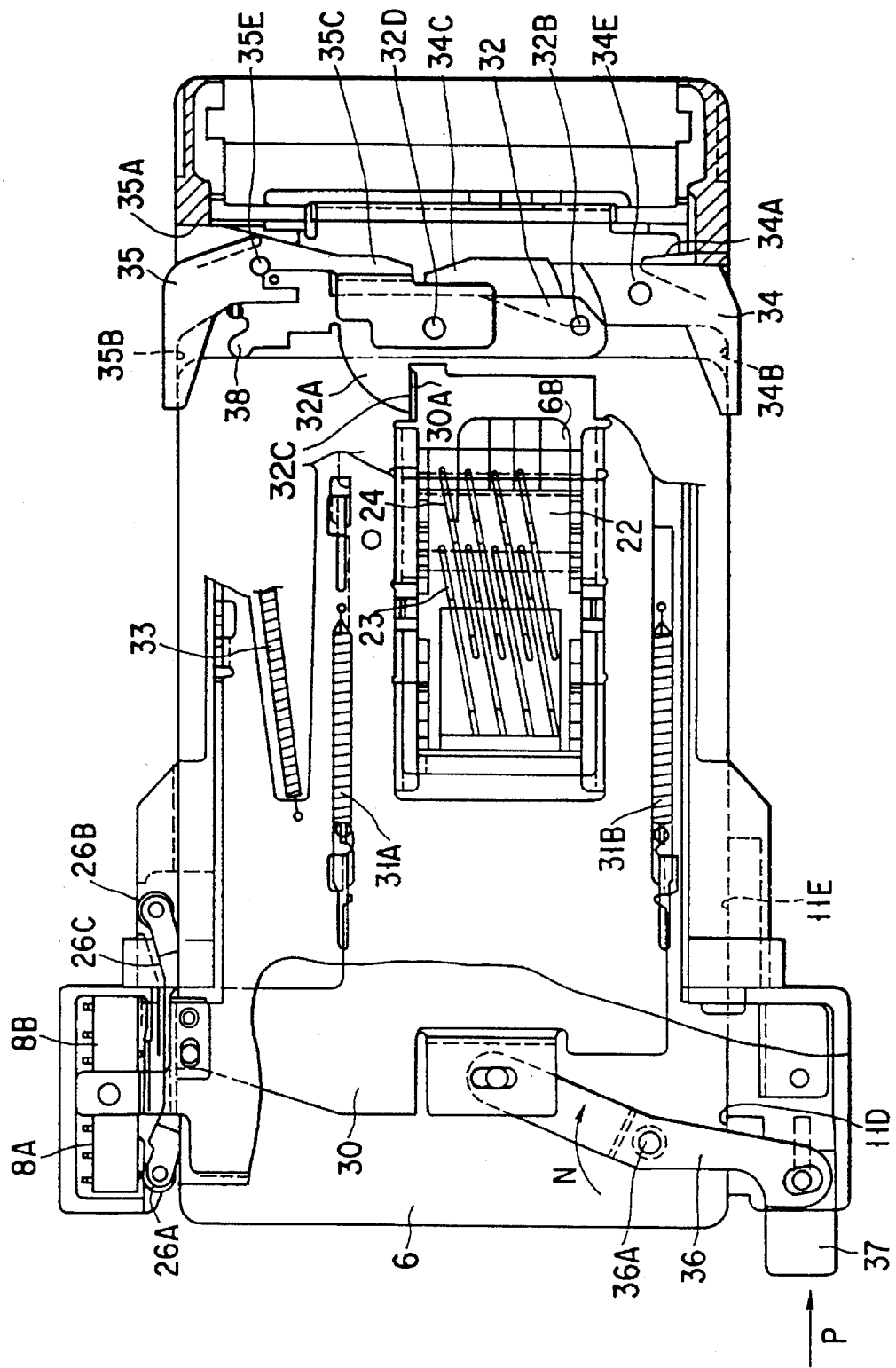
FIG. 16 is a partial cutaway plan view showing the embodiment in which an IC card is set.
Figure 17:
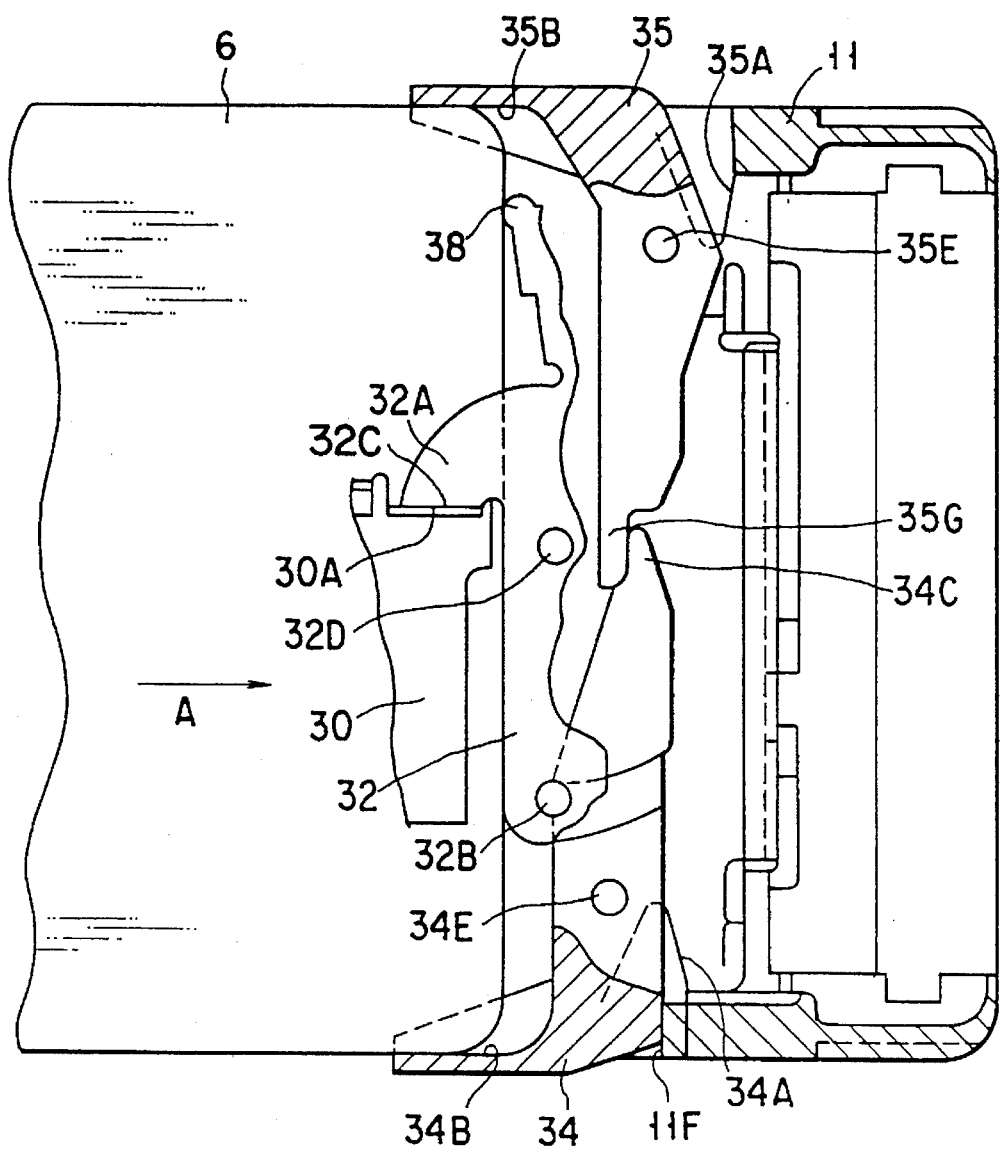
FIG. 17 is a partial cutaway plan view showing the state of an IC card reaching the read/write position.

As the IC card 6 proceeds, the lever 32 pivots around a shaft 32D in the clockwise direction (indicated by arrow E) from the state shown in FIGS. 14 and 15. When the IC card 6 comes to a predetermined position for reading/writing shown in FIGS. 16 and 17, the fan-shaped portion 32A, which has been pressing the bent-up portion 30A of the slider 30, pivots along with the lever 32 to the final position for the fan-shaped portion 32A. Thus, as shown in FIGS. 16 and 17, the slider 30 is moved in the right-hand side direction (indicated by arrow A) by the forces of the springs 31A and 31B.

During the movement of the slider 30, the crankshaped projections 30C and 30D move on the cam surfaces 22C, 22D, and 22E of the contact holder along with the movement as explained in connection with FIGS. 7 and 8, pushing the contact holder 22 down as shown in FIG. 8.

Consequently, the ends 23B and 24B of the contacts 23 and 24 are connected to the contact portion 6B located on the IC card 6.

The cam surfaces 22B, 22D, and 22E of the contact holder 22 can be formed differently from those of the embodiment, and the movement of the contacts 23 and 24 to approach the IC card 6 may be different from that of the embodiment. Further, regardless of the person who operates the device, the movement of the contacts can be always standardized as constant. For example, when the slope between the cam surfaces 22D and 22E is set obtusely, the relative speed of the contacts 23 and 24 being brought into contact with the IC card 6 can be slowed down so as to weaken the shock of collision upon contact.

When the IC card 6 is moving to the read/write position, the lever 32 is pushed by the projection 32B of the card to pivot. Thus, the first guide member 34 on the reference side is pushed to pivot in the counter-clockwise direction (indicated by arrow K) by projecting 32B.

Consequently, the second guide member 35 is pushed by the first guide member 34 to pivot in the clockwise direction (indicated by arrow M).

The respective receiving surfaces 34B and 35B of the first guide member 34 on the reference side and the second guide member 35 or the pressing side opens outward so as to receive an IC card 6.

Further, as the IC card 6 moves, arc-like portions 6D formed on both corners of the front end of the IC card 6 push the receiving surfaces 34 of the first and second guide members 34 and 35 outward against the forces of the springs 34A and 35A serving as urging members.

When the IC card 6 is set to the predetermined position for a write/read operation, the card is disposed between the receiving surfaces 34B and 35B of the first and second guide members 34 and 35, as shown in FIGS. 16 and 17.

As mentioned before, the spring 35A urging the second guide member 35 is set stronger than the spring 34A urging the first guide member 34. The first guide member 34 (on the alignment reference side) pivoted when the IC card 6 is set to the predetermined position, abuts to the receiving portion 11F of the main frame 11. Consequently, the first guide member 34 is held from further pivoting in the direction indicated by arrow K. The position of the front end of the IC card 6 in the width direction is determined by the receiving surface 34B of the first guide member 34.

The alignment of the IC card 6 in the width direction is carried out in the following manner. The IC card is pressed against the guide rollers 26A and 26B urged by the spring 26C, and the receiving surface 35B of the second guide member 3B urged by the spring 35A, and accordingly pressed against three sites on the reference side, namely, the guide surfaces 11D and 11E and the receiving surface 34B.

The alignment in the insertion direction is carried out as the front end 6A of the IC card 6 abuts to the card abutment portion 38 of the lever 32. The pivoting of the lever 32 is controlled as the end surface 32C of the fan-shaped portion 32A abuts to the bent-up portion 30A of the slider 30. Thus, an accurate alignment is performed.

When the IC card is at the read/write position, the bent-up portion 30B of the slider 30 turns ON the switch 8B, and therefore it can be detected that the IC card 6 is set to the predetermined position.

In accordance with the movement of the slider 30, the link 36 pivots around the shaft 36A in the clockwise direction (indicated by arrow N) so as to project a release button 37 to the left.

The IC card 6 is thus ready for read/write of data.

The procedure of ejection and the operation of the IC card 6 will now be described.

In order to eject the IC card 6, the release button 37 is pushed in the direction indicated by arrow P. Accordingly, the link 36 pivots around the shaft 36A in the counter-clockwise direction (direction opposite to arrow N) so as to move the slider 30 to the left.

As the slider 30 moves to the left (direction opposite to arrow A), the bent-up portion 30A is released from the end surface 32C of the fan-shaped portion 32A of the lever 32, and the lever 32 pivots in the counter-clockwise direction (indicated by arrow D) by the force of the spring 33.

Consequently, the IC card 6 is pushed to the left-hand side by the card abutment portion 38. The exposed portion of the IC card 6 is picked up by hand to remove the card from the IC card data processing device 1.

As the lever 32 pivots, the first and second guide members 34 and 35 serving to guide the front end of the IC card 6 are returned to the state shown in FIGS. 3 and 14.

The card data processing device 1 having the above-described structure, includes a main body 9 having a card insertion opening 11G into which an IC card is inserted; contacts 23 and 24 which can be brought into contact with the contact portion 6B of the IC card 6; a control circuit portion 25A electrically connected to the contacts 23 and 24; and a connector 3 for connecting the control circuit portion 25A to a standardized memory card connector 2B of a computer 2. Such a data processing device is, when used, inserted and mounted to the memory card slot 2A of the computer 2.

The data processing device of the invention can be used or carried integrally with the computer 2 such as a portable personal computer, and therefore the area of use is not limited, improving the utility of the processing device. Further, the interface such as an RS-232C interface of the computer is not occupied by the processing device, thus the processing device can be used along with some other I/O device connected to the computer.

The width-direction alignment or the IC card 6 is carried out, while the card is set in the predetermined position, by disposing both corners of the front end of the card between a pair of guide members 34 and 35. Thus, the IC card 6 is aligned and fixed to the predetermined position, where the contacts 23 and 24 are accurately brought into contact with the contact portion 6B of the IC card 6.

The first guide member 34 on the reference side is made to abut to the receiving portion 11F serving as stopper means so as to stop the guide member from further pivoting. The urging force of the second urging member of the second guide member 35 is made stronger than that of the first urging member 34A of the first guide member 34. With such a structure, the front end side of the IC card 6 is accurately aligned with reference to the first guide means 34 on the alignment reference side.

There is provided a slider 30 sliding along the IC card insertion path 7 as the lever 32 is pushed by the front end of the IC card 6 when the card is inserted, and the lever moving by pivoting to the predetermined position. The slider 30 has a contact holder 22 holding the contacts 23 and 24, arranged to be moveable only in the direction perpendicular to the sliding direction of the slider 30. Further, provided is contact holder moving means 40 for bringing the contacts 23 and 24 into contact with the contact portion 6B of the IC card 6 by moving the contact holder 22 in the direction perpendicular to the sliding direction of the slider 30 as the slider 30 slides. With such a structure, when the IC card 6 reaches the read/write position, the contacts 23 and 24 are brought into contact with the contact portion 6B of the IC card 6. Consequently, wear-out of the contacts 23 and 24, and the contact portion 6B caused by unnecessary friction can be prevented, thereby maintaining a stable read/write state.

The contact holder 22, which requires a certain thickness, does not move in the insertion and discharge directions of the IC card 6, and therefore the thickness of the contact holder 22 can be reduced to the minimum necessary measurement, achieving the thin product device.

The card data processing device 1 has an exposed portion 1B projecting from the memory slot 2A. Therefore with the exposed portion, the data processing device can be easily inserted into or removed from the slot.

The exposed portion 1B of the card data processing device 1 has the release button 37 serving as the discharging means for the IC card 6, and therefore with the release button, the data processing device can be easily inserted into or removed from the slot, thereby enhancing the operability of the system.

The inserted portion 1A of the card data processing device 1 which is located inside the memory card slot 2A has substantially the same size and thickness as that of a memory card, and therefore the processing device can be easily carried, enhancing the operability of the system.

It should be noted that the present invention is not limited to the disclosed embodiment.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An IC card processing device for receiving an IC card having a contact on a surface of the card, said IC card processing device being detachably connectable to a memory card connector arranged at a memory card slot of a computer device, said IC card processing device comprising:

a main frame having an outer shape and size commensurate with the memory card slot and forming a card insertion path, said main frame being insertable into the memory card slot;

a contact member extending into the card insertion path and contacting the contact of said IC card when the IC card is inserted into the card insertion path;

control circuit means electrically connected to the contact member for controlling a read/write operation from the IC card through said contact member;

a connector arranged at an end portion of said main frame for electrically connecting the control circuit and the memory card connector when said main frame is inserted into the memory card slot;

a first aligning means, provided proximate a first end of the card insertion path, for aligning the IC card inserted into an opening of the card insertion path, said first aligning means including an aligning guide provided proximate the first end of the card insertion path for guiding a first side of the IC card and a card urging means facing the aligning guide for urging the first side of the IC card against the aligning guide; and a second aligning means, provided proximate a second end of the card insertion path, for aligning the IC card when said contact member is in contacting engagement with the contact of the IC card.

2. An IC card data processing device according to claim 1 wherein the card urging means includes a pair of guide rollers and a guide roller spring for urging the guide rollers in a direction perpendicular to an insertion direction of the IC card.

3. An IC card data processing device according to claim 1 wherein the second aligning means includes:

first guide member means for aligning the IC card in a width direction by pressing a first corner of a from end of the IC card, the first guide member means being pivotable;

second guide member means for aligning the IC card in the width direction by pressing a second corner of the front end of the IC card, the second guide member means pivoting outward from the width direction of the IC card responsive to movement of the first guide member means; and moving member means provided in the card insertion path and pivotable when pushed by the front end of the IC card when inserted for pivoting the first and second guide member means to guiding positions.

4. An IC card processing device according to claim 3 wherein the second aligning means further includes:

first urging member means for urging the first guide member means in a direction opposite to a direction in which the first guide member means is pivoted by the moving member means;

second urging member means for urging the second guide member means in a direction opposition to a direction in which the second guide member means is pivoted by the first guide member means; and stopper means for controlling the pivoting of the first guide member means so that the first guide member means does not pivot further than an alignment reference position for the IC card.

5. An IC card data processing device according to claim 4 wherein an urging force generated by the second urging member means is stronger than an urging force generated by the first urging member means so that the second guide member means urges the IC card toward the first guide member means more strongly than the first guide member means urges the IC card toward the second guide member means.

6. An IC card processing device according to claim 4 wherein the first and second guide member means are urged by the first and second urging member means such that the first and second guide members means pivot toward a center portion of the main structure.

7. An IC card processing device according to claim 4 wherein said first guide member means has a portion that engages a projection formed on the moving member means and a receiving surface for receiving a first from corner of the IC card when the receiving surface is at a predetermined position and said second guide member means has a portion that engages the first guide member means and a receiving surface for receiving a second front corner of the IC card when the receiving surface is at a predetermined position, such that when the front edge of said IC card pushes the moving member means, the pivoting of the moving member means causes the first guide member means to pivot toward the predetermined position and the pivoting of the first guide member means causes the second guide member means to pivot toward the predetermined position.

8. An IC card processing device according to claim 4 wherein the moving member means is a lever having a card abutment portion made of a self-lubricating material which is abutted by the front end of the IC card.

9. An IC card processing device for receiving an IC card having a contact on a surface of the card, said IC card processing device being detachably connectable to a memory card connector arranged at memory card slot of a computer device, said IC card processing device comprising:

a main frame having an outer shape and size commensurate with the memory card slot and forming a card insertion path, said main frame being insertable into the memory card slot;

a slider provided along the card insertion path of the main frame and slidably disposed in an insertion/discharge direction of the IC card;

urging means for urging the slider at all times in an insertion direction of the IC card;

a moving member, provided on the IC card insertion path, which is disposed to pivotably move responsive to being pushed by a front end of the IC card when said IC card is inserted into the card insertion path;

inhibiting means for resisting movement of the slider due to an urging force of the urging means until the moving member is pivoted to a position where a read/write operation on the IC card is performed;

a contact member facing the card insertion path and contacting the contact of the IC card when said IC card is inserted into the card insertion path;

a contact holder for holding the contact member and being movable in a direction perpendicular to a moving direction of the slider;

contact holder moving means for moving the contact holder in a direction perpendicular to the moving direction of the slider responsive to movement of the slider;

a control circuit electrically connected to the contact member for controlling the read/write operation on the IC card; and a connector arranged at an end portion of said main frame for electrically connecting the control circuit and the memory card connector when said main frame is inserted into the memory card slot.

10. An IC card processing device according to claim 9, wherein the inhibiting means is a fan-shaped stopper disposed on the moving member to abut against the slider.

11. An IC card processing device according to claim 10, where an end portion of the fan-shaped stopper has an aligning portion aligning the IC card after movement of the slider.

12. An IC card processing device according to claim 9, wherein the contact holder moving means includes a guide groove, having cam surfaces, formed on opposing side surfaces of the contact holder and a crank-shaped projection portion extending from the slider for engaging with the guide groove.

13. An IC card processing device according to claim 9, where said contact member is an elongated member fitted into a slender groove formed in the contact holder and has a contact portion extending below a lower surface of the contact holder.

14. An IC card processing device according to claim 9, further including a discharge means provided near an entrance of the card insertion path for moving the slider against an urging force of the urging means, the discharge means including a release button and a link for connecting the release button with the slider.

15. An IC card processing device according to claim 9, wherein the control circuit includes a first switch operated by a guide roller which moves by being pushed by the IC card and a second switch operated responsive to movement of the slider.

16. An IC card processing device for receiving an IC card having a contact portion on a surface of the card, said IC card processing device being detachably connectable to a memory card connector arranged at a memory card slot of a computer device, said IC card processing device comprising:

a first portion having an outer shape and size commensurate with the memory card slot and insertable into the memory card slot, said first portion forming a card insertion path for accepting the IC card in the same direction as the direction in which the first portion is inserted into the memory card slot;

a second portion provided at a first end of the first portion and projecting from the memory card slot when the first portion is inserted into the memory card slot, said second portion forming an insertion opening for the IC card to be inserted into the card insertion path;

a pair of guide members provided at the insertion opening of the second portion for guiding opposing side of the IC card in the direction normal to the direction in which the IC card is inserted into the card insertion path;

a connector provided at a second end of the first portion, connected to the memory card connector in the memory card slot;

a contact member provided on one side of the card insertion path in the first portion and located between the second portion and the connector, said contact being brought into contact with the contact portion of the surface of the IC card during a read/write operation; and a control circuit electrically connected to the contact and the connector for controlling data transfer between the IC card and the connector.

17. An IC card processing device according to claim 16, further comprising:

a slider provided in the card insertion path of the first portion, moveable when pressed by the IC card when the IC card is inserted;

an urging member for urging the slider in a card ejecting direction;

a rotation member, provided for the first portion and rotated as the IC card is inserted, for holding the slider in a fixed position against an urging force of the urging member when the IC card is inserted to a predetermined position in the card insertion path; and an operating member for releasing the slider from the fixed position so that the IC card is ejected by movement of the slider in the card ejecting direction with the urging force of the urging member.

18. An IC card processing device for receiving an IC card having a contact portion on a surface of the card, said IC card processing device being detachably connectable to a memory card connector arranged at a memory card slot of a computer device, said IC card processing device comprising:

a main frame having an outer shape and measurement commensurate with the memory card slot and forming a card insertion path, said main frame being detachably insertable into the memory card slot;

a slider provided along the card insertion path of the main frame and slidably disposed in an insertion/discharge direction of the IC card;

urging means for urging the slider at all times in an insertion direction of the IC card;

a moving member provided on the card insertion path which is disposed to pivotably move responsive to insertion of the IC card inserted into the card insertion path;

inhibiting means for resisting movement of the slider by an urging force of the urging means until the moving member is pivoted to a position where a read/write operation from the IC card is performed;

a contact member facing the IC card insertion path and disposed to engagably contact the contact portion of the IC card when the IC card is inserted into the card insertion path;

a control circuit electrically connected to the contact for controlling the read/write operation from the IC card; and a connector arranged at an end portion of said main frame for electrically connecting the control circuit and the memory card connector when said main frame is inserted into the memory card slot.

19. An IC card processing device according to claim 18, further comprising:

a contact holder for holding the contact member and being movable in a direction perpendicular to a moving direction of the slider; and contact holder moving means for moving the contact holder in a direction perpendicular to the moving direction of the slider and responsive to movement of the slider.

* * * * *